United States Patent
Oh

(10) Patent No.: US 11,393,538 B2
(45) Date of Patent: Jul. 19, 2022

(54) DATA STORAGE DEVICE AND METHOD OF OPERATING THE SAME

(71) Applicant: SK hynix Inc., Icheon-si (KR)

(72) Inventor: Ok Kyun Oh, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 21 days.

(21) Appl. No.: 17/006,194

(22) Filed: Aug. 28, 2020

(65) Prior Publication Data

US 2021/0287751 A1 Sep. 16, 2021

(30) Foreign Application Priority Data

Mar. 16, 2020 (KR) .................. 10-2020-0032008

(51) Int. Cl.

| | |
|---|---|
| *G11C 16/10* | (2006.01) |
| *G11C 16/26* | (2006.01) |
| *G06F 3/06* | (2006.01) |
| *G11C 16/04* | (2006.01) |
| *G11C 16/34* | (2006.01) |
| *G11C 11/56* | (2006.01) |

(52) U.S. Cl.
CPC .......... *G11C 16/26* (2013.01); *G06F 3/0604* (2013.01); *G06F 3/0659* (2013.01); *G06F 3/0673* (2013.01); *G11C 16/0483* (2013.01); *G11C 16/3418* (2013.01); *G11C 11/5642* (2013.01); *G11C 11/5671* (2013.01)

(58) Field of Classification Search
CPC . G11C 16/26; G11C 16/0483; G11C 16/3418; G06F 3/0604; G06F 3/0659; G06F 3/0673
USPC ....................................... 365/189.15
See application file for complete search history.

(56) References Cited

U.S. PATENT DOCUMENTS

| | | | | |
|---|---|---|---|---|
| 2016/0099047 A1* | 4/2016 | Lee | ............... | G11C 7/1039 365/185.03 |
| 2018/0012663 A1* | 1/2018 | Alhussien | ......... | H03M 13/6325 |
| 2019/0130967 A1* | 5/2019 | Danjean | .............. | G11C 11/5635 |

FOREIGN PATENT DOCUMENTS

| | | |
|---|---|---|
| KR | 10-2010-0013187 A | 7/2008 |
| KR | 10-2017-0097267 A | 8/2017 |

* cited by examiner

*Primary Examiner* — Xiaochun L Chen
(74) *Attorney, Agent, or Firm* — Perkins Coie LLP

(57) ABSTRACT

A data storage device having a reduced overhead according to an embodiment of the disclosed technology may include a plurality of memory chips each including a plurality of planes, and a memory controller configured to perform recovery algorithms that recover data corresponding to failed read operations among read operations performed on the plurality of memory chips, and the memory controller may generate a read voltage to be used in a first recovery algorithm using an address related to a selected read operation among the failed read operations and perform the first recovery algorithm on a memory location associated with the failed read operations using the read voltage.

17 Claims, 15 Drawing Sheets

FIG. 9A 212-2(1)

| Optimum Read Voltage | Chip Address |
|---|---|
| Vopt1 | Chip1 |
| Vopt2 | Chip2 |
| Vopt3 | Chip3 |
| Vopt4 | Chip4 |
| ⋮ | ⋮ |

FIG. 9B 212-2(2)

| Optimum Read Voltage | Plane Address |
|---|---|
| Vopt1 | Plane2 |
| Vopt2 | Plane1 |
| Vopt3 | Plane3 |
| Vopt4 | Plane4 |
| ⋮ | ⋮ |

FIG. 9C 212-2(3)

| Optimum Read Voltage | Block Address |
|---|---|
| Vopt1 | BLK2 |
| Vopt2 | BLK4 |
| Vopt3 | BLK3 |
| Vopt4 | BLK1 |
| ⋮ | ⋮ |

DATA STORAGE DEVICE AND METHOD OF OPERATING THE SAME

CROSS-REFERENCE TO RELATED APPLICATION

This patent document claims priority to and benefits of the Korean patent application number 10-2020-0032008, filed on Mar. 16, 2020, which is incorporated herein by reference in its entirety.

TECHNICAL FIELD

The technology and implementations disclosed in this patent document relate to an electronic device, and more particularly, to a data storage device that can avoid unnecessary decoding overhead during a read operation.

BACKGROUND

A data storage device may include a memory device that stores data and a controller that allows a host device such as a computer or a smartphone to read the data from and/or write the data to the data storage media. The memory device may be characterized as a volatile memory device or a non-volatile memory device depending on its capability to hold stored data even if the power is turned off.

The volatile memory device can retain the stored data only when the power is on. Examples of the volatile memory device include a static random access memory (SRAM) and a dynamic random access memory (DRAM).

The non-volatile memory device can retain the stored data even in the absence of a power source. Examples of the non-volatile memory device include a read only memory (ROM), a programmable ROM (PROM), an electrically programmable ROM (EPROM), an electrically erasable and programmable ROM (EEPROM), and a flash memory.

SUMMARY

The embodiments of the disclosed technology, among other features and benefits, provide a data storage device that can avoid unnecessary decoding and computing overhead and complexity during a read operation.

A memory controller implemented based on an embodiment of the disclosed technology may include an interface in communication with a memory device including a plurality of memory chips each including a plurality of memory locations, an optimum read voltage retry controller configured to generate a first optimum read voltage corresponding to a physical address of a memory location that has failed a read operation among a plurality of read operations for the memory device, and a read fail controller in communication with the optimum read voltage retry controller and the interface and configured to control the memory device to perform an optimum read voltage retry operation on another memory location using the first optimum read voltage from the optimum read voltage retry controller, and the plurality of read operations may be performed in response to a same read request provided from a host.

A data storage device implemented based on an embodiment of the disclosed technology may include a plurality of memory chips each including a plurality of planes, and a memory controller configured to perform recovery algorithms that recover data corresponding to failed read operations among read operations performed on the plurality of memory chips, and the memory controller may generate a read voltage to be used in a first recovery algorithm using an address related to a selected read operation among the failed read operations and performs the first recovery algorithm on a memory location associated with the failed read operations using the read voltage.

A method of operating a data storage device including a plurality of memory chips implemented based on an embodiment of the disclosed technology may include generating an optimum read voltage corresponding to a physical address of a memory location that has failed a read operation among a plurality of read operations of reading data stored in the plurality of memory chips, and performing the plurality of read operations using the optimum read voltage, and the plurality of read operations may be read operations performed responsive to a same read request provided from a host.

A memory controller implemented based on an embodiment of the disclosed technology controls a memory device including a plurality of memory chips each including a plurality of planes. The memory controller may include an optimum read voltage retry controller configured to calculate a first optimum read voltage corresponding to a physical address of a failed read operation among a plurality of read operations for the memory device, and a read fail controller configured to control the memory device to perform an optimum read voltage retry performing the plurality of read operations using the first optimum read voltage, and the plurality of read operations may be read operations generated by one read request provided from a host.

A storage device implemented based on an embodiment of the disclosed technology may include a plurality of memory chips each including a plurality of planes, and a memory controller configured to perform recovery algorithms that recover data corresponding to failed read operations among read operations performed on the plurality of memory chips, and the memory controller may calculate a read voltage to be used in a first recovery algorithm using an address related to a selected read operation among the failed read operations and perform the first recovery algorithm on the failed read operations using the read voltage.

A method of operating a data storage device including a plurality of memory chips implemented based on an embodiment of the disclosed technology may include calculating an optimum read voltage corresponding to a physical address of a failed read operation among a plurality of read operations of reading data stored in the plurality of memory chips, and performing the plurality of read operations using the optimum read voltage, and the plurality of read operations may be read operations generated by one read request provided from a host.

BRIEF DESCRIPTION OF THE DRAWINGS

FIGS. 9A to 9C shows examples of data storage for storing optimum read voltages, as illustrated in FIG. 2.

DETAILED DESCRIPTION

The technology disclosed in this patent document can be implemented in some embodiments to provide data storage devices and their operating methods that, among other features and benefits, can reduce the overhead and complexity associated with decoding read data.

Figure 1:
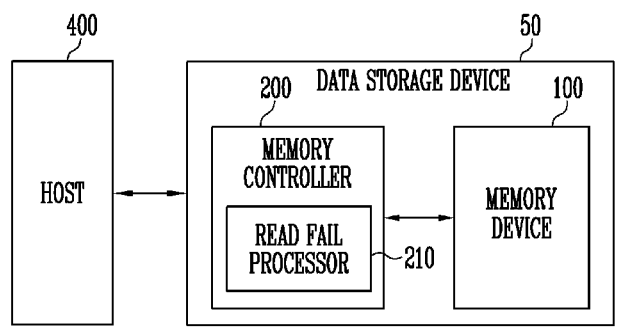
FIG. 1 is a block diagram illustrating an example configuration of a data storage device based on an embodiment of the disclosed technology.

FIG. 1 is a block diagram illustrating a configuration of a data storage device based on an embodiment of the disclosed technology.

In some implementations, the data storage device 50 may include a memory device 100 for storing data and a memory controller 200 coupled to the memory device 100 to control operations of the memory device 100. The memory device 100 is structured to include one or more memory chips and each memory chip may include memory cells or locations and circuitry supported by a semiconductor substrate.

The data storage device 50 may be coupled to and/or in communication with a host 400 such as a cellular phone, a smartphone, an MP3 player, a laptop computer, a desktop computer, a game player, a TV, a tablet PC, or an in-vehicle infotainment system to store data transmitted from the host 400 or provide stored data to the host 400 upon request.

The data storage device 50 may be implemented in one of various types of data storage devices that is compatible with a host interface in communication with the host 400. For example, the data storage device 50 may be an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, or a memory stick.

The package types for the data storage device 50 may include, for example, a package on package (POP), a system in package (SIP), a system on chip (SOC), a multi-chip package (MCP), a chip on board (COB), a wafer-level fabricated package (WFP), and a wafer-level stack package (WSP).

The memory controller 200 may control the overall operations of the data storage device 50. When the data storage device 50 is powered on, the memory controller 200 may execute firmware (FW). In some implementations, the firmware may include a flash translation layer (FTL). When the memory device 100 includes a flash memory device, the memory controller 200 may use the FTL between a general-purpose file system and the flash memory device to manage the operations of the memory device 100. In some implementations, the FTL controls how data is stored and retrieved to and from the memory device 100. Hard disk drives have been key storage devices, and thus file systems for hard disk drives are being used as general-purpose file systems. Memory systems having flash memory devices can utilize such general-purpose file systems, but they are suboptimal for several reasons, such as erasing blocks and wear leveling. For example, flash memory blocks need to be erased before they can be written to, and thus the memory systems having flash memory devices need to have information associated with erasing blocks, which hard disk drives do not need. Therefore, the FTL is used between the general-purpose file system and the flash memory device.

Upon receipt of a write request from the host 400, the memory controller 200 may receive a write data to be stored in the memory device 100 and a logical address (LA) for identifying corresponding write data from the host 400. The memory controller 200 may convert the logical address (LA) to a physical address (PA) indicating a physical address of memory cells in which the write data is stored among memory cells included in the memory device 100. In an embodiment, one physical address (PA) may correspond to one physical page. The memory controller 200 may provide a program command, the physical address, and the write data for storing data to the memory device 100.

In an embodiment, upon receipt of a read request from the host 400, the memory controller 200 may receive a logical address (LA) corresponding to the read request from the host 400. Here, the logical address (LA) corresponding to the read request may be used to identify read requested data. The memory controller 200 may obtain a physical address (PA) mapped to the logical address (LA) corresponding to the read request from map data indicating a mapping relationship between the logical address (LA) provided by the host 400 and the physical address (PA) of the memory device 100. Thereafter, the memory controller 200 may provide a read command and the physical address (PA) to the memory device 100. In various embodiments, during the erase operation, the memory controller 200 may provide an erase command and a physical address (PA) of the memory block to be erased to the memory device 100.

In an embodiment, the memory controller 200 may control the memory device 100 to independently perform the program operation, the read operation, or the erase operation regardless of a request from the host 400. For example, the memory controller 200 may control the memory device 100 to perform background operations such as wear leveling, garbage collection, or read reclaim.

The memory device 100 may store data. The memory device 100 operates under control of the memory controller 200. The memory device 100 may include a plurality of memory chips. Each of the plurality of the memory chips may include a plurality of planes. The plane may be a region that may independently operate. Each plane may independently perform any one of a program operation, a read operation, and an erase operation.

In the examples described here, the word "plane" may indicate a group of memory cells on which concurrent operations can take place. The word "memory block" may indicate the smallest unit that can be erased, and the word "page" may indicate the smallest unit that can be programmed (or written to) or read. In some implementations, each memory chip includes one or more planes, and each plane includes a plurality of blocks. Each block includes a plurality of pages.

Specifically in FIG. 1, the memory device 100 may include a memory cell array including a plurality of memory cells that can store data. The memory cell array may include a plurality of memory blocks. Each memory block may include a plurality of memory cells. The memory block may be the smallest unit that can be erased. That is, erase operations are performed on a memory block basis, and data stored in the same memory block may be simultaneously erased. In an embodiment, the memory block may include a plurality of pages. The page may be the smallest unit for storing data in the memory device 100 or reading data stored in the memory device 100. That is, program (write) operations and read operations are performed on a page basis, and a physical address provided from the memory controller 200 to the memory device 100 during the program operation or the read operation may be an address for identifying a specific page.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. By way of example, the memory device 100 may be a NAND flash memory as will be discussed below.

In an embodiment, the memory device 100 may be implemented in a three-dimensional array structure. The flash memory device may include an electrical charge storage layer, either a conductive floating gate (FG) formed of a conductive material or a charge trap layer formed of a dielectric material.

In an embodiment, each of the memory cells included in the memory device 100 may operate as one of a single level cell (SLC) that stores one data bit, a multi-level cell (MLC) that stores two data bits, a triple level cell (TLC) that stores three data bits, or a quad level cell (QLC) that stores four data bits.

In an embodiment of the disclosed technology, the memory controller 200 may include a read fail processor 210.

The read request provided from the host 400 indicate where the data to be read out is. In an example, the host 400 requests that the memory device 100 provide original data that was stored in the data storage device 50 by the host 400. The memory controller 200 performs error correction encoding on the original data to generate write data including parity data for error correction. The memory controller 200 may control the memory device 100 such that the write data is stored in the memory device 100.

Thereafter, in response to the read request from the host 400, the memory controller 200 may provide a read command and a physical address for locating the memory cells from which data to be read.

The memory device 100 may perform the read operation using a default read voltage. The read voltage may be a voltage applied to identify the data stored in the memory cell. The default read voltage may be a read voltage determined through a test in a production process of the memory device 100.

In the context of this patent document, the "default" read voltage can indicate initial read voltage values given for the default condition of the memory device 100. In some cases, the word "default" can be used to indicate an ideal value, and thus the default read voltage can indicate a set of read threshold voltages that can distinguish different threshold voltage distributions of the memory cells in an ideal condition.

The memory device 100 may provide, to the memory controller 200, the data stored in the memory cells corresponding to the received physical address using the default read voltage. The data read out from the memory device 100 will be referred to as read data. The read data may indicate values that are read from a memory device; for example, a single read operation conducted over a memory location (memory cell) may produce a binary value of either zero or one in a binary storage scheme. During the read operation, the memory controller 200 may perform error correction decoding on the read data.

When the read data includes one or more erroneous bits, such errors can be corrected by performing an error correction operation on the read data. In other words, the error correction decoding may be an operation of correcting one or more erroneous bits included in the read data to recover the original data. The error correction decoding may fail to recover the original data if the number of error bits included in the read data exceeds the maximum number of correctable error bits. The error correction decoding may successfully recover the original data when the number of error bits included in the read data is equal to or less than the maximum number of correctable error bits. When the error correction decoding is successful, the original data corresponding to a logical address requested by the host 400 to be read may be obtained. In some implementations, whether the error correction decoding is successful can be indicated as "pass" or "fail" for the corresponding read operation. Therefore, when the error correction decoding is successful, the read operation performed by the memory device 100 may be indicated as "pass." When the error correction decoding is not successful, the original data may not be restored, and the read operation performed by the memory device 100 may be indicated as "fail."

When the read operation is failed, the read fail processor 210 may perform a plurality of recovery algorithms until the original data is successfully restored. The plurality of recovery algorithms may be performed in a preset sequence. In general, the more complex the recovery algorithm, the higher the probability of recovering the original data is. However, as the iteration of operations or the amount of computations to be performed by the memory controller 200 increases, the operational and computational overhead may also be increased. In an embodiment, the read fail processor 210 may perform the recovery algorithm in a sequence from a recovery algorithm having low complexity to a recovery algorithm having high complexity. When the original data is restored by any of the recovery algorithms, remaining recovery algorithms may not be performed.

In an embodiment, the plurality of recovery algorithms may include, for example, a read retry operation, an optimum read voltage retry operation, a soft decoding operation, and a chip kill recovery operation.

The read retry may be an operation of retrying the read operation using a read voltage (read threshold voltage) different from the default read voltage. In some implementations, the read voltage used in the read retry may be stored in the memory device 100 or the memory controller 200 in advance.

The optimum read voltage retry may be an operation of calculating an optimum read voltage and performing the read operation using the calculated optimum read voltage. Here, the optimum read voltage may be calculated by various methods. In an embodiment, the optimum read voltage may be calculated using Gaussian modeling. Alternatively, the optimum read voltage may be calculated according to the number of '0' or '1' included in the read data that is read out using a plurality of read voltages.

In the context of this patent document, the words optimal, optimized or optimum that are used in conjunction with threshold values or the memory system performance to indicate values or conditions that provide a better performance for the memory device (e.g., higher reliability, fewer detected errors, etc.) than existing threshold values or conditions. In this sense, the words optimum, optimized or optimal may or may not convey the best possible performance achievable by the memory device.

The soft decoding may be an operation of performing read operations using a plurality of soft read voltages. Here, the plurality of soft read voltages may be determined based on the default read voltage or the optimum read voltage. For example, the plurality of soft read voltages may be voltages having a magnitude increased or decreased by a predetermined interval based on the default read voltage or the optimum read voltage.

The chip kill recovery operation may be an operation of recovering data stored in a page where the read operation is failed, using data stored in other pages.

In an embodiment of the disclosed technology, when the plurality of read operations are failed, the read fail processor 210 may control the memory device 100 to perform the optimum read voltage retry on memory cells that have failed the read operations. The read fail processor 210 may calculate the optimum read voltage using a threshold voltage distribution of memory cells corresponding to any failed read operation. The read fail processor 210 may control the memory device 100 to perform the optimum read voltage retry on the other memory cells that have failed read operations, using the optimum read voltage obtained using the threshold voltage distribution associated with the failed read operation. Therefore, in obtaining the optimum read voltage, the read fail processor 210 implemented based on some embodiments of the disclosed technology does not take into account all of the failed read operations, and thus the overhead for calculating the optimum read voltage may be reduced.

In an embodiment, the read fail processor 210 may selectively perform the soft decoding on the memory cells that have failed the read operations associated with the optimum read voltage retry. That is, the read fail processor 210 may compare a physical address of the memory cells that have failed the read operation associated with the optimum read voltage retry and a physical address of the read operation by which the optimum read voltage is calculated. When the physical address of the memory cells that have failed the read operation associated with the optimum read voltage retry belongs to the same plane as the physical address of the read operation by which the optimum read voltage is calculated, the read fail processor 210 may perform the soft decoding and repeat the optimum read voltage retry operations with respect to read operations that belong to different planes. Therefore, the failure of the optimum read voltage retry does not necessarily lead to the soft decoding, and thus the operational and computational overhead may be reduced compared to a case where the soft decoding is performed on all the memory cells that have failed the optimum read voltage retry.

The host 400 may communicate with the data storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
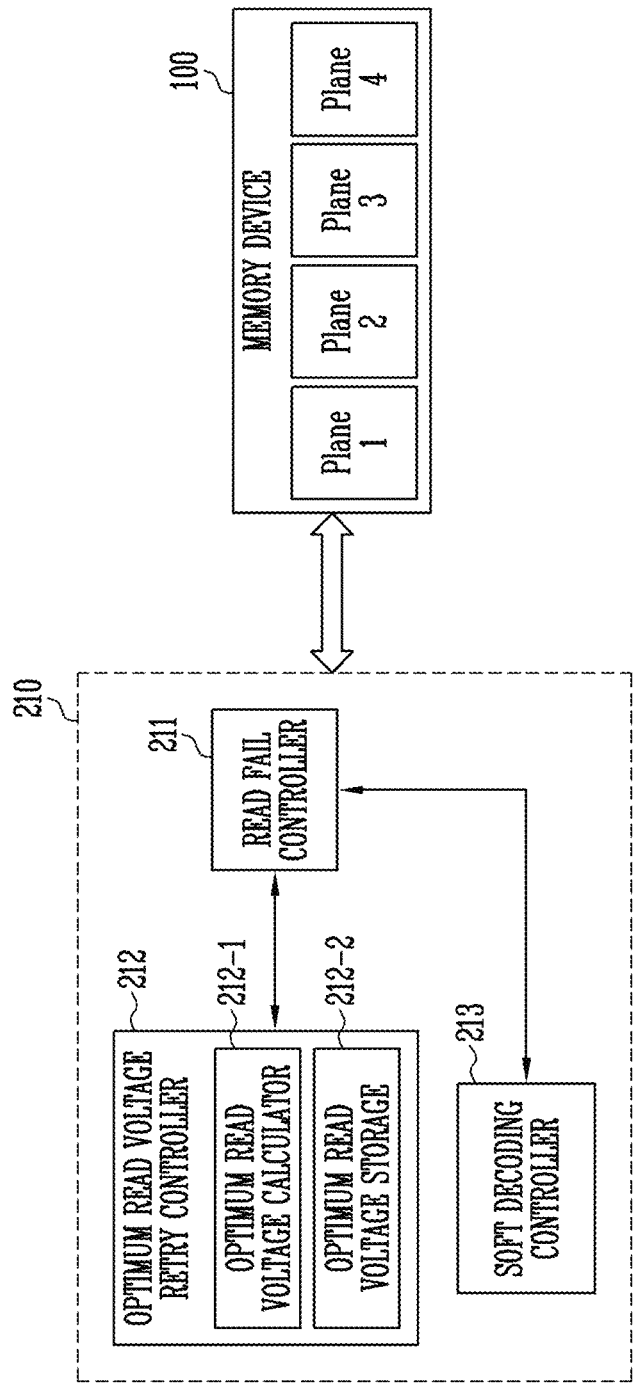
FIG. 2 shows an example of a read fail processor illustrated in FIG. 1.

FIG. 2 shows an example of the read fail processor illustrated in FIG. 1.

In some implementations, the read fail processor 210 may include a read fail controller 211, an optimum read voltage retry controller 212, and a soft decoding controller 213.

The optimum read voltage retry controller 212 may further include an optimum read voltage calculator 212-1 and an optimum read voltage storage 212-2.

In FIG. 2, the read fail processor 210 includes the read fail controller 211, the optimum read voltage retry controller 212, and the soft decoding controller 213. In some implementations, the read fail processor 210 may further include an error correction component (not shown) that performs error correction decoding to determine the performed read operation to be either "pass" or "fail."

The read fail controller 211 may determine the recovery algorithm to be performed for a recovery of the original data on the failed read operation. The read fail controller 211 may determine the recovery algorithm to be performed on a failed read operation among the plurality of recovery algorithms in a preset sequence. The plurality of recovery algorithms may include the read retry, the optimum read voltage retry, the soft decoding, and the chip kill recovery operation. However, for convenience of description, in FIG. 2, it is assumed that the read fail controller 211 determines the recovery algorithm to be performed among the optimum read voltage retry and the soft decoding on the failed read operation.

When the read operation using the default read voltage is failed, the read fail controller 211 may control the optimum read voltage retry controller 212 to perform the optimum read voltage retry. The optimum read voltage retry controller 212 may calculate the optimum read voltage based on the threshold voltage distribution of the memory cells corresponding to the physical address of the failed read operation. The optimum read voltage retry controller 212 may store the calculated optimum read voltage together with the physical address on which the calculation is based.

In some implementations, the optimum read voltage calculator 212-1 may calculate the optimum read voltage based on the threshold voltage distribution of the memory cells corresponding to the physical address of the failed read operation.

In an embodiment, the optimum read voltage calculator 212-1 may calculate the optimum read voltage using Gaussian modeling. For example, the optimum read voltage calculator 212-1 may calculate average voltages of the threshold voltage distribution using a plurality of sampling voltages. The optimum read voltage calculator 212-1 may calculate the average voltages of the threshold voltage distribution using the number of '0' or '1' or a change amount of the number of '0' or '1' of sampling data obtained using the plurality of sampling voltages. The optimum read voltage calculator 212-1 may calculate the optimum read voltage using the average voltages. The optimum read voltage calculator 212-1 may determine a median value (½ of a sum of the average voltages) of the average voltages of the threshold voltage distributions adjacent to each other as the optimum read voltage. In various embodiments, the optimum read voltage calculator 212-1 may calculate the optimum read voltage using various methods in addition to the calculation method using Gaussian modeling, and thus the scope of the disclosed technology is not limited to a method of calculating the optimum read voltage using Gaussian modeling.

The optimum read voltage storage 212-2 may store the optimum read voltage calculated by the optimum read voltage calculator 212-1 together with the physical address on which the calculation of the optimum read voltage is based. Here, the physical address stored together with the optimum read voltage may include at least one of a chip address, a plane address, or a block address.

The read fail controller 211 may control the memory device 100 to perform the optimum read voltage retry using the optimum read voltage calculated by the optimum read voltage retry controller 212.

In an embodiment, a plurality of read operations may be performed according to the read request provided by the host. For example, when the memory controller 200 detects memory blocks belonging to different memory devices 100 or different planes as one superblock, the plurality of read operations may be concurrently performed. Alternatively, when the logical address of the read request provided by the host is a sequential read, the plurality of read operations may be performed according to the sequence or the priority of the read request. In this case, two or more failed read operations may occur among the plurality of read operations. When the plurality of read operations failed, the read fail controller 211 may not calculate the optimum read voltage for each read operation. The read fail controller 211 may calculate the optimum read voltage for any one selected read operation, and then perform the optimum read voltage retry on the remaining memory cells that have failed read operations, using the optimum read voltage calculated for the selected read operation.

The read fail controller 211 may control the soft decoding controller 213 to perform the soft decoding on the memory cells that have failed the read operation associated with the optimum read voltage retry. In an embodiment, the read fail controller 211 may determine whether to repeat the optimum read voltage retry or perform the soft decoding on the memory cells that have failed the read operation associated with the optimum read voltage retry according to a comparison result of the physical address of the memory cells that have failed the read operation associated with the optimum read voltage retry with the physical address of the memory cell selected for the read operation on which the calculation of the optimum read voltage is based.

Specifically, the read fail controller 211 may compare the physical address of the memory cells that have failed the read operation associated with the optimum read voltage retry with the physical address of the selected read operation stored in the optimum read voltage storage 212-2. When a plane address of the memory cells that have failed the read operation associated with the optimum read voltage retry is the same as a plane address of the selected read operation, the read fail controller 211 may control the soft decoding controller 213 to perform the soft decoding on the memory cells that have failed the read operation associated with the optimum read voltage retry. Conversely, when the plane address of the memory cells that have failed the read operation associated with the optimum read voltage retry is different from the plane address of the selected read operation, the read fail controller 211 may control the optimum read voltage retry controller 212 to hold off performing the soft decoding and perform the optimum read voltage retry again.

In various embodiments, when at least one of the chip address, the plane address, or the block address of the read operation in which the optimum read voltage retry is failed is the same as the chip address, the plane address, or the block address of the selected read operation, the read fail controller 211 may control the soft decoding controller 213 to perform the soft decoding on the memory cells that have failed the read operation associated with the optimum read voltage retry. When the chip address, the plane address, or the block address of the memory cells that have failed the read operation associated with the optimum read voltage retry is different from the chip address, the plane address, or the block address of the selected read operation, the read fail controller 211 may control the optimum read voltage retry controller 212 to hold off performing the soft decoding and perform the optimum read voltage retry again.

When the optimum read voltage used in the optimum read voltage retry is calculated with respect to the read operation belonging to the same plane, chip, or block, even if the optimum read voltage retry is repeated, there is a significant probability that the optimum read voltage retry is failed. Conversely, when the optimum read voltage used in the optimum read voltage retry is calculated with respect to the read operation belonging to other plane, chip, or block, the optimum read voltage retry may be required to be performed using a newly calculated optimum read voltage. Since the soft decoding requires more computations and operations than the optimum read voltage retry, performance of the selective soft decoding described above may reduce the operational and computational overhead of the memory controller.

Figure 3:
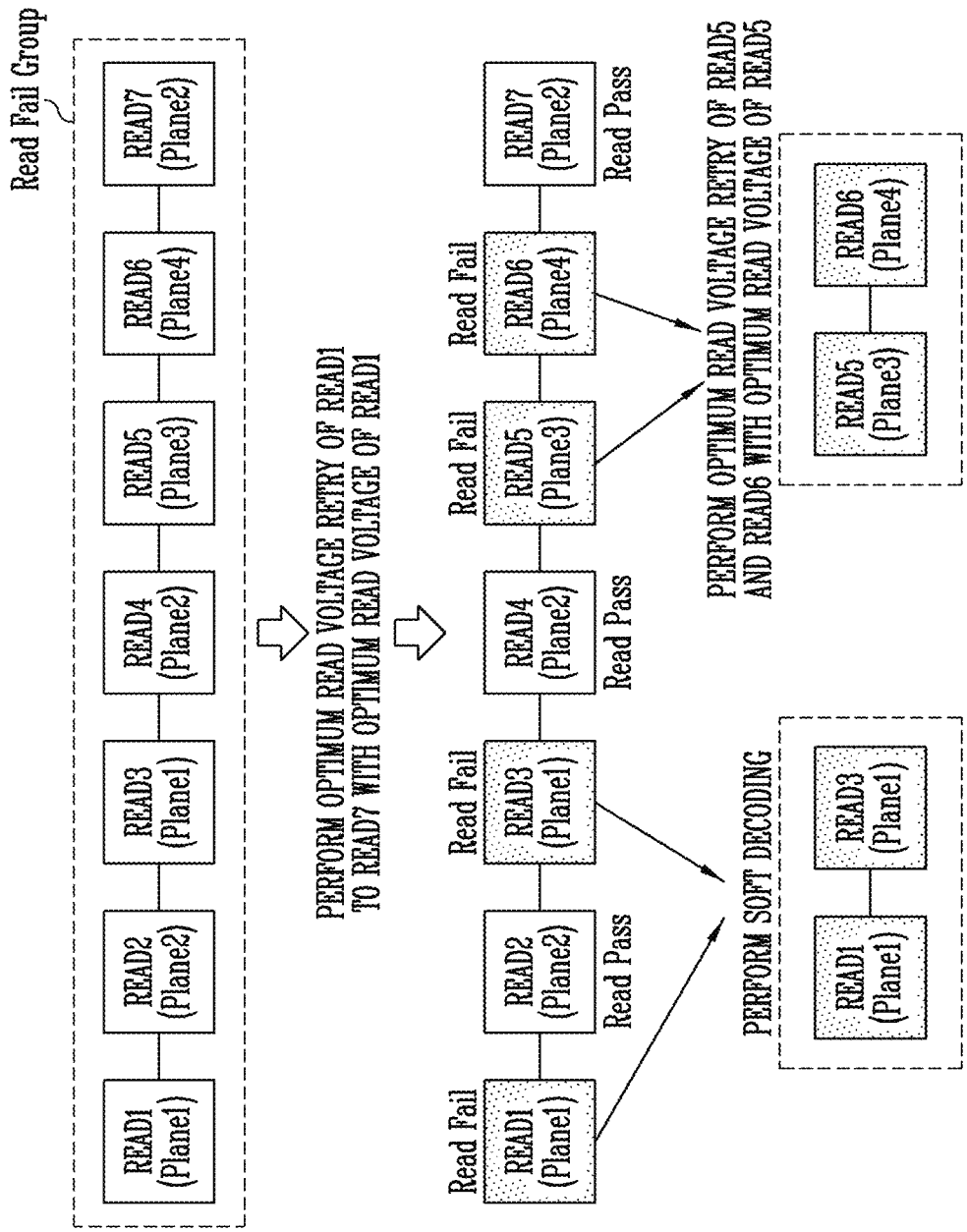
FIG. 3 shows an example of an operation of the data storage device based on an embodiment of the disclosed technology.

FIG. 3 shows an example of an operation of the data storage device based on an embodiment of the disclosed technology.

In FIG. 3, it is assumed that the data storage device includes one memory device and one memory device includes four planes Plane1 to Plane4. However, this is for convenience of description, and in various embodiments, the disclosed technology may be applied to a data storage device including a plurality of memory devices.

Referring to FIGS. 2 and 3, the data storage device may perform the plurality of read operations in the sequence of the requests from the host. Provided a plurality of read operations fails over a plurality of planes, the soft decoding or the optimum read voltage retry operation can be performed on the memory cells that have failed the read operations. The memory cells that have failed the read operations belong to a read fail group. It is assumed that such failed read operations have been performed using the default read voltage. The example illustrated in FIG. 3 is as follows: (1) a first read operation READ1 and a third read operation READ3 belonging to the read fail group are read operations that are performed on a page included in the first plane Plane1; (2) a second read operation READ2, a fourth read operation READ4, and a seventh read operation READ7 are read operations that are performed on a page included in the second plane Planet; (3) a fifth read operation READ5 is a read operation that is performed on a page included in the third plane Plane3; and (4) a sixth read operation READ6 is a read operation that is performed on a page included in the fourth plane Plane4.

The read fail controller 211 may generate an optimum read voltage for the first read operation READ1. The optimum read voltage may be generated using Gaussian modeling. The read fail controller 211 may control the memory device 100 to perform the optimum read voltage retry operation on the memory cells associated with the first to seventh read operations READ1 to READ7 using the optimum read voltage.

It is assumed that, as a result of performing the optimum read voltage retry, the optimum read voltage retry has failed with respect to the memory cells associated with the first read operation READ1, the third read operation READ3, the fifth read operation READ5, and the sixth read operation READ6, and the optimum read voltage retry has succeeded or passed with respect to the memory cells associated with the second read operation READ2, the fourth read operation READ4, and the seventh read operation READ7.

In some embodiments of the disclosed technology, the soft decoding is performed when the memory cells that have failed read operations are in the same plane as the memory cells that is used to obtain the optimum read voltage used for the failed read operations. Since the first read operation READ1 and the third read operation READ3 are read operations for the page included in the first plane Plane1, the first read operation READ1 and the third read operation READ3 are read operations for the same plane as the first read operation READ1 on which the calculation of the optimum read voltage is based. Therefore, the read fail controller 211 may perform the soft decoding on the first read operation READ1 and the third read operation READ3.

In some embodiments of the disclosed technology, the optimum read voltage retry operation is performed when the memory cells that have failed read operations are in a different plane from the memory cells that is used to obtain the optimum read voltage used for the failed read operations. The fifth read operation READ5 and the sixth read operation READ6 are read operations for a plane address different from the first plane Plane1, which is a plane address of the first read operation READ1 on which the calculation of the optimum read voltage is based. Therefore, the optimum read voltage retry is performed again for the fifth read operation READ5 and the sixth read operation READ6. Therefore, the read fail controller 211 may perform the optimum read voltage retry operation again on the memory cells associated with the fifth read operation READ5 and the sixth read operation READ6. In this case, the read fail controller 211 may generate a new optimum read voltage for the fifth read operation READ5. The read fail controller 211 may perform the optimum read voltage retry on the memory cells associated with the fifth read operation READ5 and the sixth read operation READ6 again using the new optimum read voltage for the fifth read operation READ5.

The optimum read voltage retry and the soft decoding are described as an example with reference to FIGS. 2 and 3, however, such a method may be applied to the plurality of recovery algorithms. That is, the read fail controller 211 may perform a first recovery algorithm by applying the read voltage determined for the selected read operation among the plurality of failed read operations to the remaining failed read operations. In addition, the read fail controller 211 may selectively apply a second recovery algorithm only to read operations having the same tendency as the read operation that is the basis for determining the read voltage of the previously applied first recovery algorithm rather than applying the second recovery algorithm having high complexity and a slow process speed to all the read operations.

Figure 4:
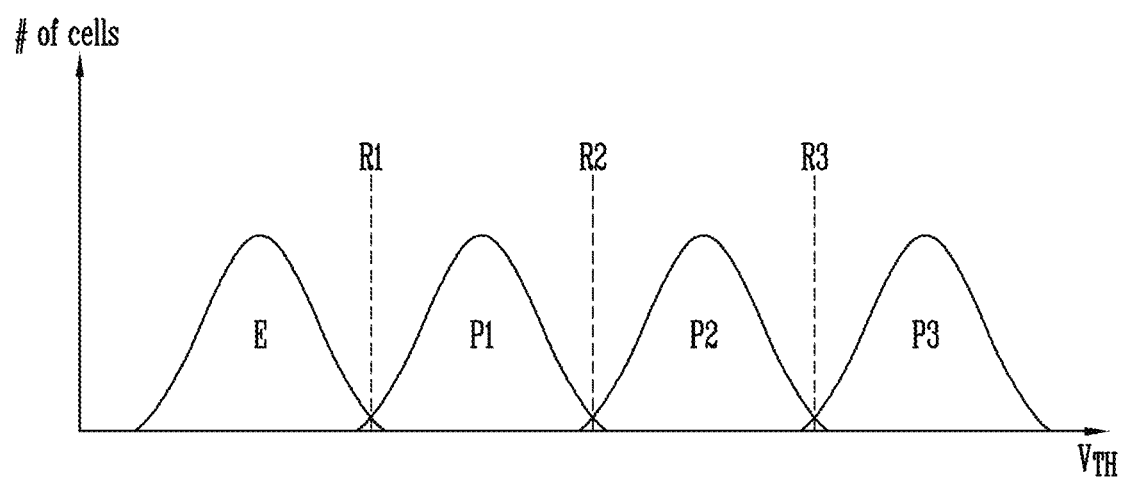
FIG. 4 show default (ideal) read voltages.

FIG. 4 shows default (ideal) read voltages.

In FIG. 4, a horizontal axis represents a threshold voltage of the memory cells, and a vertical axis represents the number of memory cells.

In FIG. 4, for convenience of description, it is assumed that the memory cell is programmed as a multi-level cell (MLC) storing two bits of data, but the disclosed technology is not limited thereto.

The memory cells included in one physical page may have a threshold voltage belonging to a threshold voltage distribution of any one of an erase state E and a first program state P1 to a third program state P3 through the program operation.

When the threshold voltage of the memory cells are sensed using default read voltages R1, R2, and R3, each memory cell may be divided into any one of the erase state E and the first program state P1 to the third program state P3 according to the data stored in the memory cell. R1 may be the default read voltage for dividing the erase state E and the first program state P1, R2 may be the default read voltage for dividing the first program state P1 and the second program state P2, and R3 may be the default read voltage for dividing the second program state P2 and the third program state P3. A level of the default read voltage may be determined as a specific voltage value by a test in a production process of the memory device, and the determined voltage value may be stored in the memory device.

In an initial period when the program operation is completed, the threshold voltage distribution of the memory cells has a form of FIG. 4. However, the threshold voltage may be changed (disturbance) because data is left (retention) for a long time after the data is programmed or due to an excessive operation for another memory area.

Therefore, as change of the threshold voltage of the memory cells increases, a lot of error bits may be included in the read data sensed by the default read voltage, and thus a case where the read operation is failed may increases.

Figure 5:
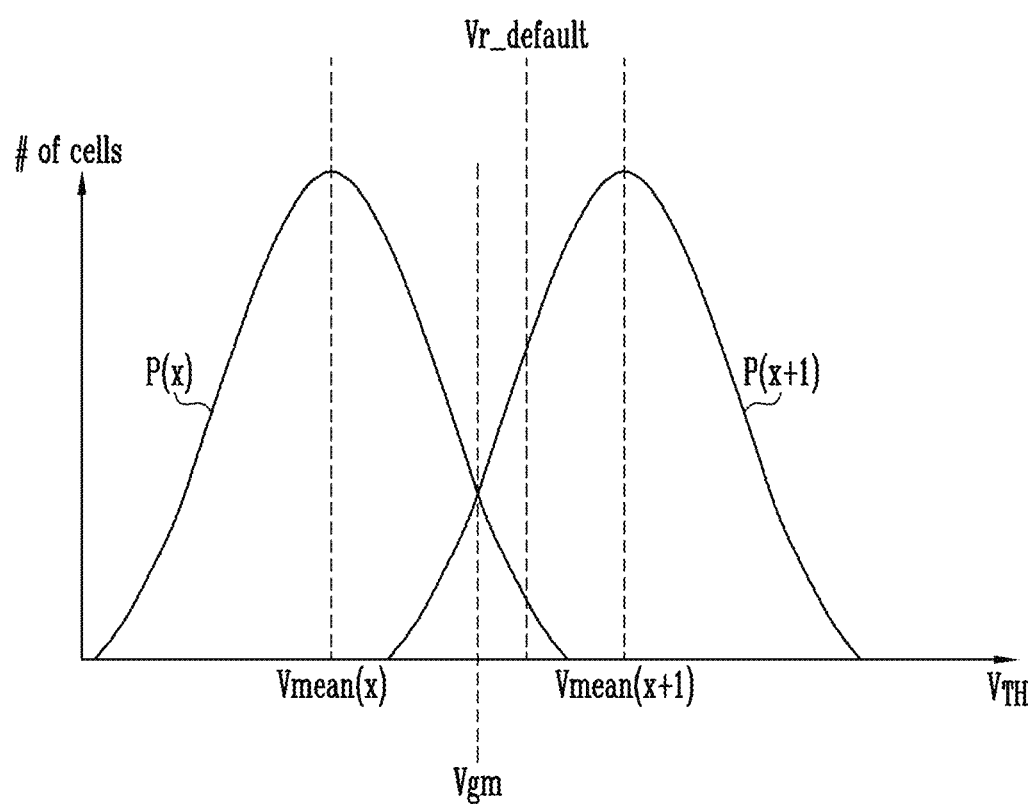
FIG. 5 shows an example method of obtaining an optimum read voltage.

FIG. 5 shows an example method of obtaining the optimum read voltage.

FIG. 5 is a diagram generalizing and expressing the threshold voltage distribution of states adjacent to each other among the erase state E and the first program state P1 to the third program state P3 of FIG. 4.

In some implementations, the threshold voltage distribution on the left represents the threshold voltage distribution of the memory cells in a P(x) state, and the threshold voltage distribution on the right represents the threshold voltage distribution of the memory cells in a P(x+1) state.

The threshold voltages of the memory cells in the P(x) state and the P(x+1) state may be changed a lot compared to when the initial program is completed, and thus the threshold voltage distributions of the two states may overlap. In this case, even though the read operation is performed with a default read voltage Vr_default, a lot of error bits may be included in the read data.

The memory controller may obtain an average voltage of the threshold voltage distribution in the P(x) state by performing the read operation using the plurality of sampling voltages. For example, the memory controller may calculate the average voltage of the threshold voltage distribution using the number of '0' or '1' or the change amount of the number of '0' or '1' of the sampling data obtained using the plurality of sampling voltages.

At this time, the memory controller may determine a median value (½ of sum of the average voltages) of average values (Vmean(x) and Vmean(x+1)) of the threshold voltage distributions adjacent to each other as an optimum read voltage Vgm.

Figure 6:
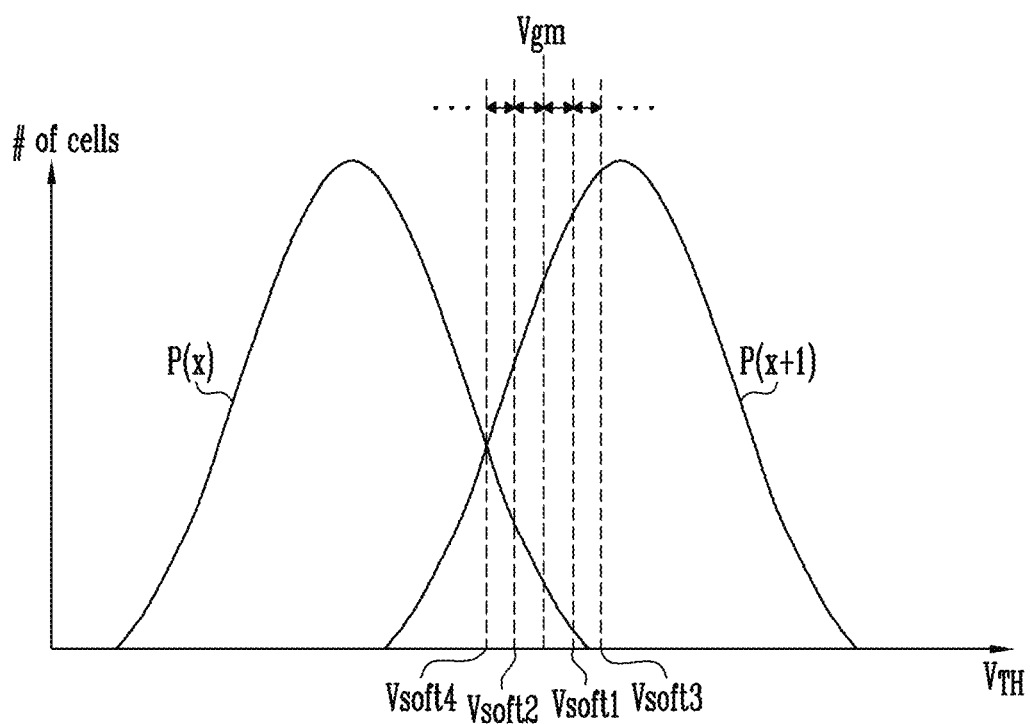
FIG. 6 shows examples of soft read voltages used in a soft decoding process.

FIG. 6 shows examples of soft read voltages used in the soft decoding process.

In some implementations, the threshold voltage of the memory cells in the P(x) state and the threshold voltage of the memory cells in the P(x+1) state may be changed more than in the case of FIG. 5. In this case, even though the read operation is performed with the optimum read voltage Vgm, the read operation may be failed.

The soft decoding may be the recovery algorithm that performs the read operation using a plurality of soft read voltages having different voltage levels. The plurality of soft read voltages used in the soft decoding may be voltages having a constant offset based on the optimum read voltage Vgm.

The memory controller may perform the read operation while changing the read voltage in a sequence of a first soft read voltage Vsoft1 to a fourth soft read voltage Vsoft4.

In various embodiments, the plurality of soft read voltages used for the soft decoding may be voltages having a constant offset based on a default read voltage Vr_default described through FIG. 5 rather than the optimum read voltage Vg m.

Figure 7:
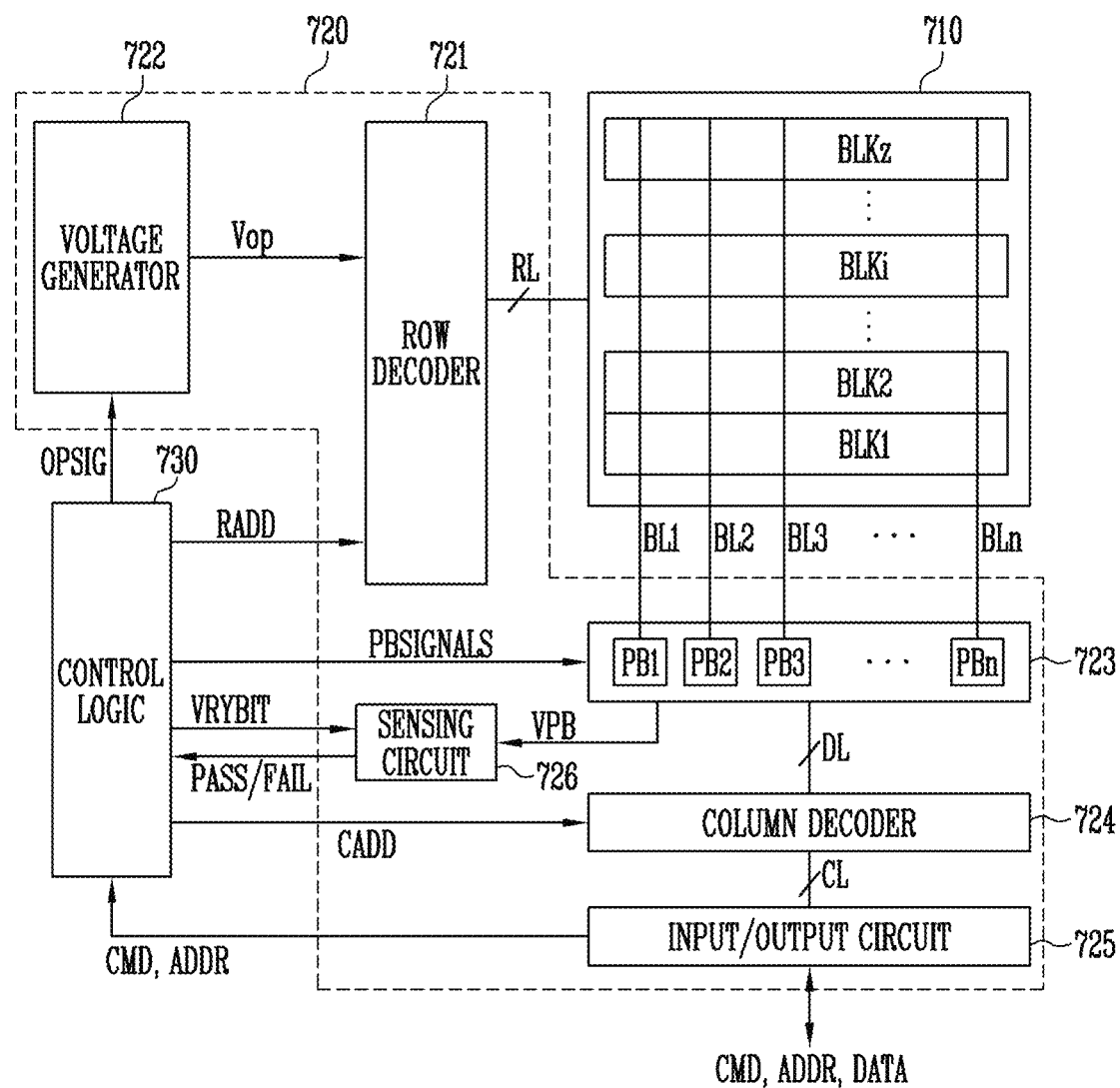
FIG. 7 shows an example of the memory device illustrated in FIG. 1 based on some embodiments of the disclosed technology.

FIG. 7 shows an example of the memory device 100 illustrated in FIG. 1 based on some embodiments of the disclosed technology.

In some implementations, the memory device may include a memory cell array 710, a peripheral circuit 720, and a control logic 730.

The memory cell array 710 includes a plurality of memory blocks BLK1 to BLKz. The plurality of memory blocks BLK1 to BLKz are connected to a row decoder 721 through row lines RL. The memory blocks BLK1 to BLKz may be connected to a page buffer group 723 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Thus, one memory block may include a plurality of pages.

The row lines RL may include at least one source select line, a plurality of word lines, and at least one drain select line.

Each of the memory cells included in the memory cell array 710 may be configured as a single level cell (SLC) storing one data bit, a multi-level cell (MLC) storing two data bits, a triple level cell (TLC) storing three data bits, or a quad level cell (QLC) storing four data bits.

The peripheral circuit 720 may be configured to perform the program operation, the read operation, or the erase operation on a selected area of the memory cell array 710 under control of the control logic 730. The peripheral circuit 720 may drive the memory cell array 710. For example, the peripheral circuit 720 may apply various operation voltages to the row lines RL and the bit lines BL1 to BLn or discharge the applied voltages under the control of the control logic 730.

Any one of the memory blocks included in the memory cell array 710 may include information on a default read voltage.

The peripheral circuit 720 may include the row decoder 721, a voltage generator 722, the page buffer group 723, a column decoder 724, and an input/output circuit 725.

The row decoder 721 is connected to the memory cell array 710 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 721 is configured to operate in response to the control of the control logic 730. The row decoder 721 receives a row address RADD from the control logic 730.

The row decoder 721 is configured to decode the row address RADD. The row decoder 721 selects at least one memory block among the memory blocks BLK1 to BLKz according to a decoded address. In addition, the row decoder 721 may select at least one word line of the memory block selected to apply voltages generated by the voltage generator 722 to at least one word line WL according to the decoded address.

For example, during the program operation, the row decoder 721 may apply a program voltage to a selected word line and apply a program pass voltage of a level lower than that of the program voltage to unselected word lines. During a program verify operation, the row decoder 721 may apply a verify voltage to the selected word line and apply a verify pass voltage higher than the verify voltage to the unselected word lines. During the read operation, the row decoder 721 may apply a read voltage to the selected word line and apply a read pass voltage higher than the read voltage to the unselected word lines.

In an embodiment, the erase operation of the memory device 100 is performed in a memory block unit. During the erase operation, the row decoder 721 may select one memory block according to the decoded address. During the erase operation, the row decoder 721 may apply a ground voltage to word lines connected to the selected memory block.

The voltage generator 722 operates in response to the control of the control logic 730. The voltage generator 722 is configured to generate a plurality of voltages using an external power voltage supplied to the memory device. Specifically, the voltage generator 722 may generate various operation voltages Vop used in the program, read, and erase operations in response to operation signal OPSIG. For example, the voltage generator 722 may generate a program voltage, a verify voltage, a pass voltage, a read voltage, an erase voltage, and the like in response to the control of the control logic 730.

As an embodiment, the voltage generator 722 may generate an internal power voltage by regulating an external power voltage. The internal power voltage generated by the voltage generator 722 is used as an operation voltage of the memory device 100.

As an embodiment, the voltage generator 722 may generate a plurality of voltages using an external power voltage or an internal power voltage.

For example, the voltage generator 722 may include a plurality of pumping capacitors that receive the internal power voltage, and selectively activate the plurality of pumping capacitors in response to the control of the control logic 730 to generate the plurality of voltages.

The generated plurality of voltages may be supplied to the memory cell array 710 by the row decoder 721.

The buffer group 723 includes first to n-th page buffers PB1 to PBn. The first to n-th page buffers PB1 to PBn are connected to the memory cell array 710 through the first to n-th bit lines BL1 to BLn, respectively. The first to n-th page buffers PB1 to PBn operate under the control of the control logic 730. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when a program pulse is applied to the selected word line, the first to n-th page buffers PB1 to PBn may transfer data DATA, which is received through the input/output circuit 725, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 725 under control of the column decoder 724.

During the erase operation, the first to n-th page buffers PB1 to PBn may float the first to n-th bit lines BL1 to BLn.

The column decoder 724 may transfer data between the input/output circuit 725 and the page buffer group 723 in response to the column address CADD. For example, the column decoder 724 may exchange data with the first to n-th page buffers PB1 to PBn through data lines DL or may exchange data with the input/output circuit 725 through column lines CL.

The input/output circuit 725 may transfer the command CMD and the address ADDR received from the memory controller 200 described with reference to FIG. 1 to the control logic 730, or may exchange the data DATA with the column decoder 724.

A sensing circuit 726 may generate a reference current in response to a permission bit signal VRYBIT during the read operation or the verify operation, and may compare a sensing voltage VPB received from the page buffer group 723 with a reference voltage generated by the reference current to output a pass signal PASS or a fail signal FAIL.

The control logic 730 may output the operation signal OPSIG, the row address RADD, the page buffer control signals PBSIGNALS, and the permission bit VRYBIT in response to the command CMD and the address ADDR to control the peripheral circuits 120.

Figure 8:
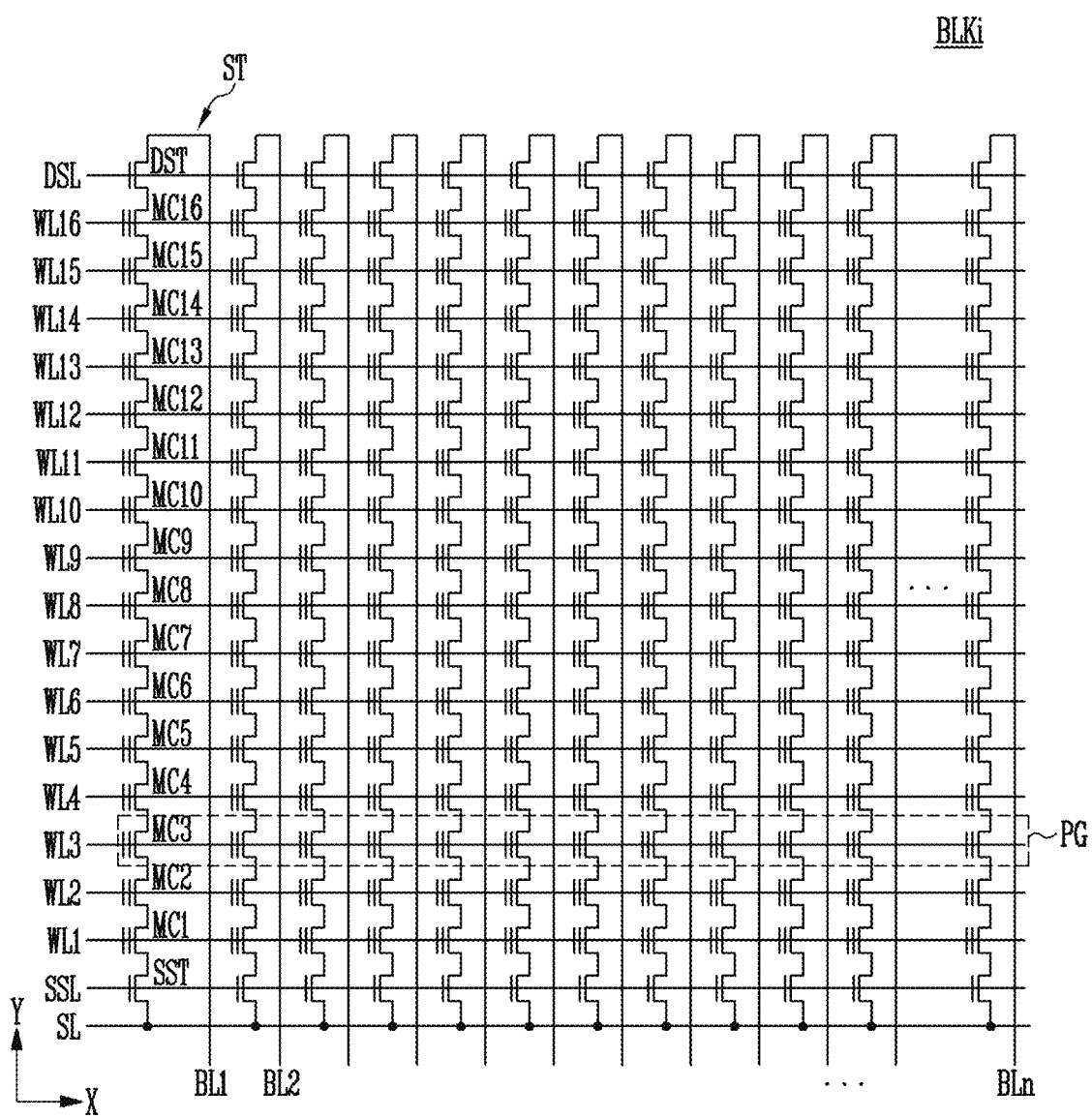
FIG. 8 shows an example of a memory block illustrated in FIG. 7.

FIG. 8 shows an example of the memory block illustrated in FIG. 7.

The memory block BLKi is any one of the memory blocks BLK1 to BLKz of FIG. 7.

Referring to FIG. 8, a plurality of word lines arranged in parallel with each other may be connected between the first select line and the second select line. Here, the first select line may be the source select line SSL, and the second select line may be the drain select line DSL. More specifically, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells MC1 to MC16, and a drain select transistor DST connected in series between the source line SL and the first bit line BL1. One string ST may include at least one source select transistor SST and at least one drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called a single level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

FIGS. 9A to 9C shows examples of data storage for storing the optimum read voltages, as illustrated FIG. 2.

FIG. 9A illustrates a state in which an optimum read voltage Optimum Read Voltage and a chip address of a memory device or memory chip on which the optimum read voltage is calculated are stored together in an optimum read voltage storage 212-2(1). In an embodiment, each of the memory chips may include two or more planes. In this case, the chip address and the plane address may be stored together in the optimum read voltage storage 212-2(1).

FIG. 9B illustrates a state in which the optimum read voltage Optimum Read Voltage and a plane address of the memory chip on which the optimum read voltage is calculated are stored together in an optimum read voltage storage 212-2(2). FIG. 9B assumes that one memory chip is included in one memory device, but the disclosed technology is not limited thereto. In an embodiment, two or more memory chips may be included in the memory device.

FIG. 9C illustrates a state in which the optimum read voltage Optimum Read Voltage and a block address of the memory chip on which the optimum read voltage is calculated are stored together in an optimum read voltage storage 212-2(3). In various embodiments, the chip address, the plane address, and the block address may be stored together in the optimum read voltage storage 212-2(3).

Figure 10:
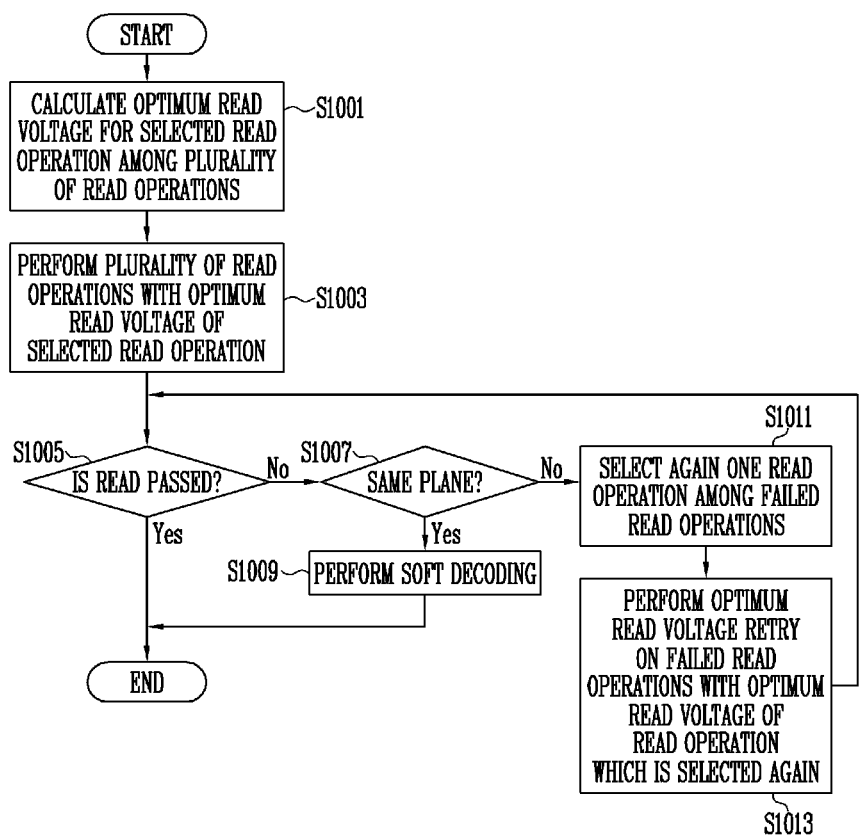
FIG. 10 is a flowchart illustrating an operation of the data storage device based on an embodiment of the disclosed technology.

FIG. 10 is a flowchart illustrating an operation of the data storage device based on an embodiment of the disclosed technology.

In some implementations, in step S1001, the data storage device calculates the optimum read voltage for the selected read operation among the plurality of read operations. Here, the plurality of read operations may be the read operation in which the read operation using the default read voltage is failed.

In step S1003, the data storage device may perform the plurality of read operations with the optimum read voltage of the selected read operation. Specifically, the data storage device may calculate the optimum read voltage for reading the memory cells included in the physical address of the selected read operation, and perform the optimum read voltage retry on the plurality of read operations using the calculated optimum read voltage. The optimum read voltage retry may be to perform the read operation using the optimum read voltage.

In step S1005, the data storage device may determine whether the optimum read voltage retry is passed. That is, when the number of error bits included in the read data on which the read operation is performed with the optimum read voltage exceeds the number of correctable error bits, the optimum read voltage retry may be failed. Conversely, when the number of error bits included in the read data on which the read operation is performed with the optimum read voltage is equal to or less than the number of correctable error bits, the optimum read voltage retry may be passed. As a result of the determination in step S1005, when the optimum read voltage retry is passed, since the original data is obtained, the operation is ended. Conversely, when the optimum read voltage retry is failed, the operation proceeds to step S1007.

In step S1007, the data storage device may determine whether the plane address of the read operation in which the optimum read voltage retry is failed is the same as the plane address of the selected read operation. As a result of the determination, the plane address of the read operation in which the optimum read voltage retry is failed is the same as the plane address of the selected read operation, the operation proceeds to step S1009, otherwise, the operation proceeds to step S1011.

In operation S1009, the data storage device may perform the soft decoding on the read operations in which the plane address of the read operation in which the optimum read voltage retry is failed is the same as the plane address of the selected read operation.

In step S1011, the data storage device may select again any one of the read operations in which the optimum read voltage retry is failed, and in step S1013, the data storage device may perform the optimum read voltage retry on the failed read operation with the optimum read voltage of the read operation which is selected again.

Figure 11:
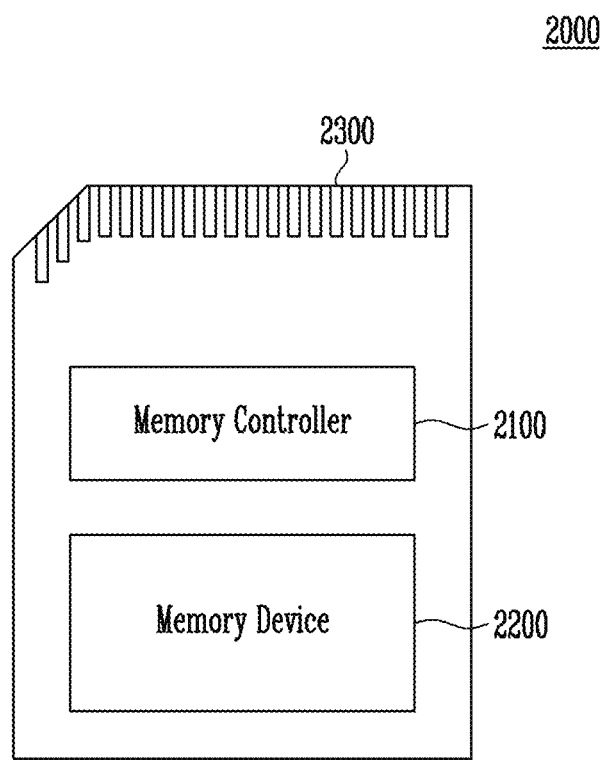
FIG. 11 is a block diagram illustrating an example of a memory card system implemented based on an embodiment of the disclosed technology.

FIG. 11 is a block diagram illustrating an example of a memory card system implemented based on an embodiment of the disclosed technology.

In some implementations, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to perform a read operation, a program operation, and an erase operation, or control a background operation of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

For example, the memory controller 2100 or the memory device 2200 may be packaged and provided as one semiconductor package in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP). Alternatively, the memory device 2200 may include a plurality of non-volatile memory chips, and the plurality of non-volatile memory chips may be packaged and provided as one semiconductor package based on the above-described package methods.

For example, the memory controller 2100 and the memory device 2200 may be integrated into one semiconductor device. For example, the memory controller 2100 and the memory device 2200 may be integrated into one semiconductor device to configure a solid state drive (SSD). The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

For example, the memory device 2200 may be the memory device 100 described with reference to FIG. 1.

Figure 12:
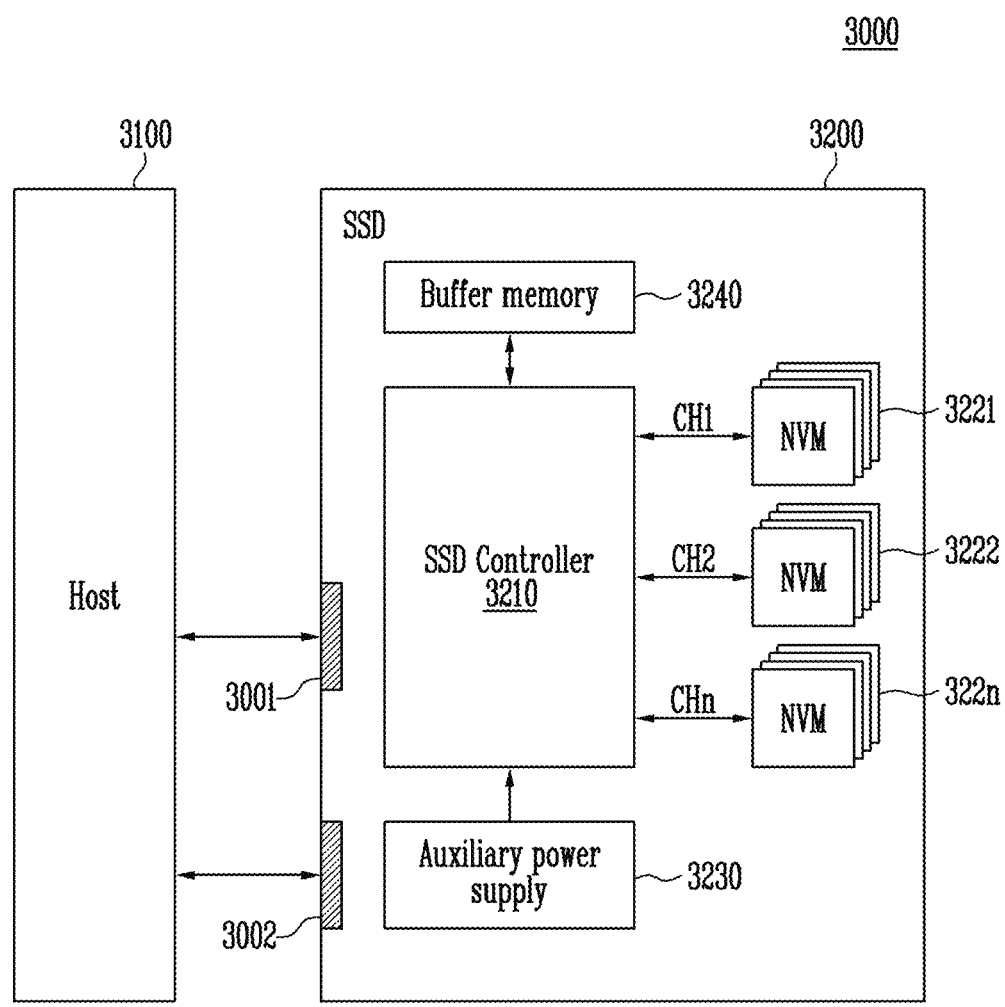
FIG. 12 is a block diagram illustrating an example of a solid state drive (SSD) system implemented based on an embodiment of the disclosed technology.

FIG. 12 is a block diagram illustrating an example of a solid state drive (SSD) system implemented based on an embodiment of the disclosed technology.

In some implementations, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-M RAM, and a PRAM.

For example, the non-volatile memories 3321 to 322n may be the memory device 100 described with reference to FIG. 1.

Figure 13:
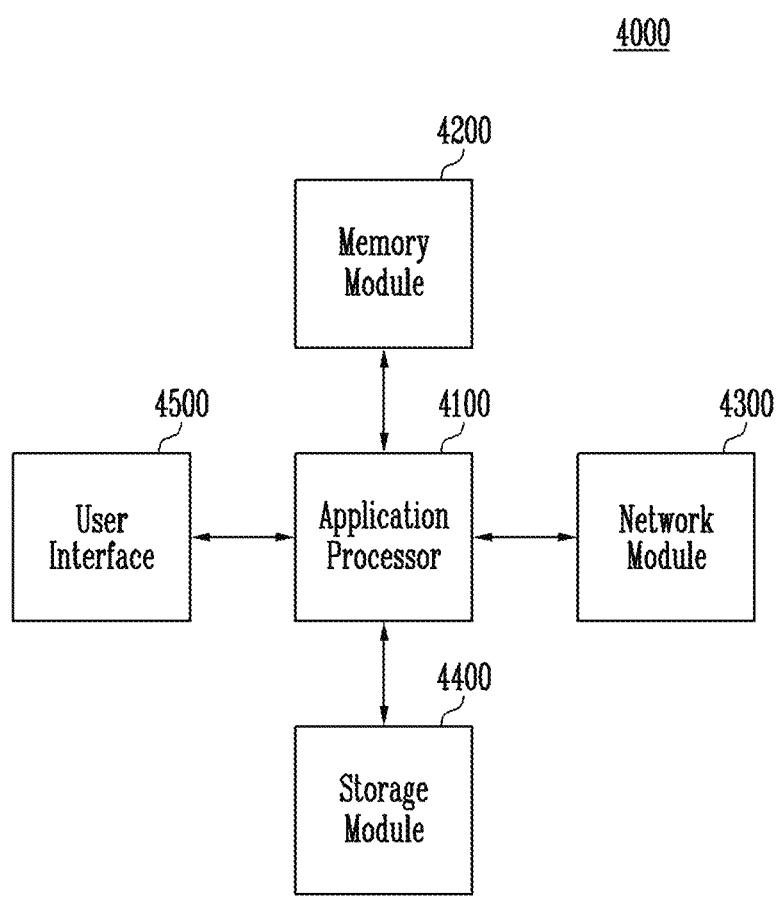
FIG. 13 is a block diagram illustrating an example of a user system implemented based on an embodiment of the disclosed technology.

FIG. 13 is a block diagram illustrating an example of a user system implemented based on an embodiment of the disclosed technology.

In some implementations, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable data storage device (removable drive), such as a memory card, and an external drive of the user system 4000.

For example, the storage module 4400 may include a plurality of non-volatile memory devices, and the plurality of non-volatile memory devices may be the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

Only limited examples, features and implementations of the disclosed technology are provided. Other features and implementations and variations may be made based on what is disclosed.

What is claimed is:

1. A memory controller comprising:
   an interface in communication with a memory device including a plurality of memory chips each including a plurality of memory locations;
   an optimum read voltage retry controller configured to generate a first optimum read voltage corresponding to a physical address of a memory location that has failed a read operation among a plurality of read operations for the memory device; and
   a read fail controller in communication with the optimum read voltage retry controller and the interface and configured to control the memory device to perform an optimum read voltage retry operation on another memory location using the first optimum read voltage from the optimum read voltage retry controller,
   wherein the plurality of read operations are performed in response to a same read request provided from a host, wherein the read fail controller is configured to apply a recovery algorithm to a read operation of a memory location that has failed the optimum read voltage retry operation, depending on whether a physical address of a memory location that has failed a read operation using the first optimum read voltage and the physical address of the memory location that has failed the read operation are the same, and wherein the recovery algorithm includes a read retry operation, the optimum read voltage retry operation, a soft decoding operation, and a chip kill recovery operation.

2. The memory controller of claim 1, wherein the read fail controller is configured to control the memory device to perform the soft decoding operation on read operations for the same physical address as the physical address of the memory location that has failed the read operation.

3. The memory controller of claim 1, wherein the read fail controller is configured to generate a second optimum read voltage corresponding to a physical address of at least one memory locations different from the physical address of the memory location that has failed the read operation.

4. The memory controller of claim 3, wherein the read fail controller is configured to perform read operations on physical addresses of memory locations different from the physical address of the memory location that has failed the read operation, using the second optimum read voltage.

5. The memory controller of claim 1, wherein the optimum read voltage retry controller includes an optimum read voltage calculator configured to calculate the first optimum read voltage by using Gaussian modeling in a threshold voltage distribution of memory cells corresponding to the physical address of the memory location that has failed the read operation.

6. The memory controller of claim 1, wherein the optimum read voltage retry controller includes an optimum read voltage storage configured to store the first optimum read voltage and the physical address of the memory location that has failed the read operation.

7. The memory controller of claim 1, further comprising:
an error correction component configured to perform error correction decoding on read data obtained from a read operation using the first optimum read voltage.

8. The memory controller of claim 1, wherein the physical address of the memory location includes a chip address mapped to any one of the plurality of memory chips.

9. The memory controller of claim 1, wherein the physical address of the memory location includes a plane address mapped to any one of a plurality of planes.

10. The memory controller of claim 1, wherein the plurality of memory locations are independently controlled by the memory controller to perform different operations simultaneously.

11. A data storage device comprising:
a plurality of memory chips each including a plurality of planes; and
a memory controller configured to perform recovery algorithms that recover data corresponding to failed read operations among read operations performed on the plurality of memory chips,
wherein the memory controller generates a read voltage to be used in a first recovery algorithm using an address related to a selected read operation among the failed read operations and performs the first recovery algorithm on a memory location associated with the failed read operations using the read voltage,
wherein the memory controller applies a recovery algorithm to a read operation of a memory location that has failed the first recovery algorithm, depending on whether an address of a memory location that has failed the first recovery algorithm and the address related to the selected read operation are the same, and
wherein the recovery algorithms include a read retry operation, an optimum read voltage retry operation, a soft decoding operation, and a chip kill recovery operation.

12. The data storage device of claim 11, wherein the memory controller performs a second recovery algorithm on a same address of a memory location as the address related to the selected read operation among read operations in which a data recovery is failed by the first recovery algorithm.

13. The data storage device of claim 11, wherein the memory controller performs the first recovery algorithm again on an address of a memory location different from the address related to the selected read operation among read operations in which a data recovery is failed by the first recovery algorithm.

14. The data storage device of claim 12, wherein a time it takes to perform the second recovery algorithm is longer than a time it takes to perform the first recovery algorithm.

15. The data storage device of claim 12, wherein a computation amount of the second recovery algorithm is greater than a computation of the first recovery algorithm.

16. A method of operating a data storage device including a plurality of memory chips, the method comprising:
generating an optimum read voltage corresponding to a physical address of a memory location that has failed a read operation among a plurality of read operations of reading data stored in the plurality of memory chips;
performing the plurality of read operations using the optimum read voltage; and
applying a recovery algorithm to a read operation of a memory location that has failed a read operation using the optimum read voltage, depending on whether a physical address of a memory location that has failed the read operation using the optimum read voltage and the physical address of the memory location that has failed the read operation are the same,
wherein the plurality of read operations are read operations performed responsive to a same read request provided from a host, and
wherein the recovery algorithm includes a read retry operation, an optimum read voltage retry operation, a soft decoding operation, and a chip kill recovery operation.

17. The method of claim 16, wherein generating the optimum read voltage comprises:
calculating the optimum read voltage using Gaussian modeling in a threshold voltage distribution of memory cells corresponding to the physical address of the memory location that has failed the read operation; and
storing the optimum read voltage and the physical address of the memory location that has failed the read operation.

* * * * *